(12) United States Patent
Kim

(10) Patent No.: US 8,110,910 B2
(45) Date of Patent: Feb. 7, 2012

(54) STACK PACKAGE

(75) Inventor: Jong Hoon Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 181 days.

(21) Appl. No.: 12/731,346

(22) Filed: Mar. 25, 2010

(65) Prior Publication Data

US 2011/0156233 A1 Jun. 30, 2011

(30) Foreign Application Priority Data

Dec. 31, 2009 (KR) ................ 10-2009-0135201

(51) Int. Cl.
*H01L 23/02* (2006.01)

(52) U.S. Cl. ............... 257/686; 257/E25.017; 257/774; 257/777; 438/108; 438/109; 361/760

(58) Field of Classification Search ......... 257/E25.017, 257/E25.013, E23.141, E23.101, 685, 686, 257/706, 723, 774, 777; 438/107–109; 361/760
See application file for complete search history.

(56) References Cited

U.S. PATENT DOCUMENTS

| | | | | |
|---|---|---|---|---|
| 4,897,708 A * | 1/1990 | Clements | ................... | 257/690 |
| 5,432,999 A * | 7/1995 | Capps et al. | ................ | 438/109 |
| 5,481,133 A * | 1/1996 | Hsu | ........................ | 257/621 |
| 5,977,640 A * | 11/1999 | Bertin et al. | ................. | 257/777 |
| 6,429,096 B1 * | 8/2002 | Yanagida | ................... | 438/459 |
| 6,429,509 B1 * | 8/2002 | Hsuan | ........................ | 257/690 |
| 6,577,013 B1 * | 6/2003 | Glenn et al. | ................. | 257/777 |
| 6,848,177 B2 * | 2/2005 | Swan et al. | ................... | 29/852 |
| 7,151,009 B2 * | 12/2006 | Kim et al. | ................... | 438/106 |
| 7,215,033 B2 * | 5/2007 | Lee et al. | .................... | 257/777 |
| 7,223,634 B2 * | 5/2007 | Yamaguchi | ................ | 438/108 |
| 7,247,935 B2 * | 7/2007 | Kawano | ..................... | 257/686 |
| 7,317,256 B2 * | 1/2008 | Williams et al. | ............ | 257/777 |
| 7,429,792 B2 * | 9/2008 | Lee et al. | .................... | 257/712 |
| 7,446,420 B1 * | 11/2008 | Kim | .............................. | 257/777 |
| 7,459,777 B2 * | 12/2008 | Nakamura | ................. | 257/686 |
| 7,531,905 B2 * | 5/2009 | Ishino et al. | ................. | 257/777 |
| 7,588,964 B2 * | 9/2009 | Kwon et al. | ................. | 438/109 |
| 7,595,559 B2 * | 9/2009 | Baek | ............................ | 257/777 |
| 7,675,181 B2 * | 3/2010 | Lee | .............................. | 257/777 |
| 7,723,213 B2 * | 5/2010 | Ichikawa | .................... | 438/464 |
| 7,763,496 B2 * | 7/2010 | Ikeda et al. | ................. | 438/109 |
| 7,795,073 B2 * | 9/2010 | Han et al. | ................... | 438/106 |

(Continued)

FOREIGN PATENT DOCUMENTS

KR 1020080051203 A 6/2008

(Continued)

*Primary Examiner* — Chris Chu

(74) *Attorney, Agent, or Firm* — Ladas & Parry LLP

(57) ABSTRACT

A stack package includes a first semiconductor chip possessing a first size and one or more second semiconductor chips possessing a second size greater than the first size. The first semiconductor chip has a first surface on which bonding pads are disposed, a second surface which faces away from the first surface, and first through-electrodes which pass through the first surface and the second surface. The one or more second semiconductor chips are stacked on the second surface of the first semiconductor chip and have second through-electrodes which are electrically connected to the first through-electrodes. A molding part abuts one or more side surfaces of the first semiconductor chip such that a total size including the first size and a size of the molding part is equal to or greater than the second size.

20 Claims, 7 Drawing Sheets

U.S. PATENT DOCUMENTS

| | | | |
|---|---|---|---|
| 7,838,967 B2 * | 11/2010 | Chen | 257/621 |
| 7,843,052 B1 * | 11/2010 | Yoo et al. | 257/686 |
| 7,894,229 B2 * | 2/2011 | Lahtinen et al. | 365/51 |
| 7,977,781 B2 * | 7/2011 | Ito et al. | 257/686 |
| 8,039,928 B2 * | 10/2011 | Kang et al. | 257/621 |
| 2002/0190371 A1 * | 12/2002 | Mashino et al. | 257/690 |
| 2005/0051883 A1 * | 3/2005 | Fukazawa | 257/686 |
| 2006/0278979 A1 * | 12/2006 | Rangel | 257/734 |
| 2007/0090517 A1 | 4/2007 | Moon et al. | 257/706 |
| 2009/0321959 A1 | 12/2009 | Hedler et al. | 257/777 |

FOREIGN PATENT DOCUMENTS

| | | |
|---|---|---|
| KR | 10-0843213 B1 | 7/2008 |

* cited by examiner

STACK PACKAGE

CROSS-REFERENCE TO RELATED APPLICATIONS

The present application claims priority to Korean patent application number 10-2009-0135201 filed on Dec. 31, 2009, which is incorporated herein by reference in its entirety.

BACKGROUND OF THE INVENTION

The present invention relates generally to semiconductor technology, and more particularly, to a stack package.

In order to accommodate the demands for miniaturization and high performance, new techniques for providing a semiconductor module of high capacity are required. One method for providing a semiconductor module of high capacity is to manufacture a highly integrated memory chip. High integration of a memory chip is accomplished by integrating an increased number of cells in the already limited space of the semiconductor chip.

However, high integration of a memory chip requires both high precision techniques, such as a technique for attaining a fine line width, and a lengthy development period. With these limitations in mind, stacking techniques have been suggested as another method for providing a semiconductor module of high capacity.

Two such stacking techniques include a first method of embedding two stacked chips in a single package and a second method of stacking two separate packages which are independently packaged. Recently, another technique has been discovered, in which through-electrodes made of a conductive material such as copper are formed in semiconductor chips in such a manner that the semiconductor chips can be electrically connected by the through-electrodes when they are stacked.

By using through-electrodes, I/O pads can be bonded with a fine pitch allowing the number of I/O pads to be increased. Further, signal transmission speed among the semiconductor chips can be improved due to the formation of an increased number of I/O pads. Also, since three-dimensional design of semiconductor chips is enabled, the performance of the semiconductor chips can be enhanced.

When manufacturing a stack package such that electrical connections between upper and lower semiconductor chips are formed through through-electrodes, if the size of a downwardly positioned chip (hereinafter referred to as a "lower chip") and an upwardly positioned chip (hereinafter referred to as an "upper chip") are different, defects are likely to occur. For example, in the event that the lower chip has a size smaller than the upper chip, the stack may be implemented while the upper chip is in a structurally unstable state, and the stack itself may be impossible.

BRIEF SUMMARY OF THE INVENTION

Embodiments of the present invention include a stack package which can secure structural stability even when an upwardly stacked chip has a size greater than a downwardly disposed chip.

In one embodiment of the present invention, a stack package comprises a first semiconductor chip possessing a first size and having a first surface on which bonding pads are disposed, a second surface which faces away from the first surface, and first through-electrodes which pass through the first surface and the second surface; one or more second semiconductor chips possessing a second size greater than the first size, stacked on the second surface of the first semiconductor chip, and having second through-electrodes which are electrically connected to one another and to the first through-electrodes; and a molding part abutting one or more side surfaces of the first semiconductor chip such that a total size including the first size and a size of the molding part is equal to or greater than the second size.

The stack package may further comprise a third semiconductor chip disposed on an uppermost second semiconductor chip among the one or more stacked second semiconductor chips to be electrically connected to the second through-electrodes of the uppermost second semiconductor chip.

The stack package may further comprise an encapsulation member formed on the molding part including one or more stacked second semiconductor chips; redistribution lines formed on the first surface of the first semiconductor chip to be connected to the bonding pads; an insulation layer formed on the first surface of the first semiconductor chip including the redistribution lines and having openings exposing portions of the redistribution lines; and external connection terminals attached to exposed portions of the redistribution lines.

The stack package may further comprise an underfill formed between the first semiconductor chip and a lowermost semiconductor chip among the one or more stacked second semiconductor chips and between the stacked second semiconductor chips.

When the first semiconductor chip has a quadrangular shape, the molding part may be formed to cover two opposite side surfaces or four side surfaces of the first semiconductor chip.

The stack package may further comprise a substrate having a third surface which faces the first surface of the first semiconductor chip and on which first connection pads to be electrically connected to the bonding pads of the first semiconductor chip are disposed, and a fourth surface which faces away from the third surface and on which second connection pads are disposed; connection members electrically connecting the bonding pads of the first semiconductor chip and the first connection pads of the substrate; an encapsulation member formed on the third surface of the substrate including the second semiconductor chips and the molding part; and external connection terminals attached to the second connection pads of the substrate.

The stack package may further comprise an underfill formed in a space between the first semiconductor chip and molding part and the substrate.

The stack package may further comprise a substrate having a window, a third surface which faces the first surface of the first semiconductor chip, and a fourth surface which faces away from the third surface and on which first connection pads are disposed to be electrically connected to the bonding pads of the first semiconductor chip and second connection pads are disposed outside the first connection pads; connection members passing through the window and connecting the bonding pads of the first semiconductor chip and the first connection pads of the substrate; an encapsulation member formed to seal the third surface of the substrate including the second semiconductor chips and the molding part and the window of the substrate including the connection members; and external connection terminals attached to the second connection pads of the substrate.

The stack package may further comprise an adhesive member interposed between the molding part and the substrate.

In another embodiment of the present invention, a stack package comprises a first semiconductor chip possessing a first size and having a first surface on which bonding pads are disposed, a second surface which faces away from the first surface, and first through-electrodes which pass through the first surface and the second surface; one or more second semiconductor chips possessing a second size greater than the first size, stacked on the second surface of the first semiconductor chip, and having second through-electrodes which are electrically connected to one another and to the first through-electrodes and third through-electrodes which are electrically connected with one another; a dummy chip disposed under a lowermost second semiconductor chip among the one or more stacked second semiconductor chips and separated from the first semiconductor chip, and having fourth through-electrodes which are electrically connected to the third through-electrodes; and a molding part abutting one or more side surfaces of the first semiconductor chip and dummy chip such that a size that is equal to or greater than the second size can be obtained.

The third through-electrodes may be formed through portions of the second semiconductor chips which are separated from the second through-electrodes.

The dummy chip may be formed without a circuit section therein and be only formed with the fourth through-electrodes therein.

When the first semiconductor chip has a quadrangular shape, the molding part may be formed to cover two opposite side surfaces or four side surfaces of the first semiconductor chip and the dummy chip.

The stack package may further comprise a third semiconductor chip disposed on an uppermost second semiconductor chip among one or more stacked second semiconductor chips to be electrically connected to the second through-electrodes of the uppermost second semiconductor chip.

The stack package may further comprise an encapsulation member formed on the molding part including one or more stacked second semiconductor chips; redistribution lines formed on the first surface of the first semiconductor chip to be electrically connected to the bonding pads and the fourth through-electrodes; an insulation layer formed on the first surface of the first semiconductor chip including the redistribution lines and having openings exposing portions of the redistribution lines; and external connection terminals attached to exposed portions of the redistribution lines.

The stack package may further comprise an underfill formed between the first semiconductor chip and dummy chip and the lowermost second semiconductor chip among the one or more stacked second semiconductor chips and between the stacked second semiconductor chips.

In another embodiment of the present invention, a stack package comprises a first semiconductor chip possessing a first size and having a first surface on which bonding pads are disposed, a second surface which faces away from the first surface, and first through-electrodes which pass through the first surface and the second surface; one or more second semiconductor chips possessing a second size greater than the first size, stacked on the second surface of the first semiconductor chip, and having second through-electrodes which are electrically connected to one another and to the first through-electrodes; a molding part abutting one or more side surfaces of the first semiconductor chip such that a total size including the first size and a size of the molding part is equal to or greater than the second size; a heat spreader disposed between the first semiconductor chip, molding part and a lowermost second semiconductor chip among one or more stacked second semiconductor chips and extending along a side surface of the one or more second semiconductor chips; an underfill formed in spaces between the stacked second semiconductor chips; redistribution lines formed on the first surface of the first semiconductor chip to be connected to the bonding pads; an insulation layer formed on the first surface of the first semiconductor chip including the redistribution lines and having openings exposing portions of the redistribution lines; and external connection terminals attached to the exposed portions of the redistribution lines.

The head spreader may be formed such that portions of the heat spreader disposed along side surfaces of the stacked second semiconductor chips contact the side surfaces of the stacked second semiconductor chips.

The head spreader may be formed such that portions of the heat spreader disposed along side surfaces of the stacked second semiconductor chips are separated from the side surfaces of the stacked second semiconductor chips.

The stack package may further comprise an underfill formed in spaces between the side surfaces of the stacked second semiconductor chips and the heat spreader.

The stack package may further comprise a third semiconductor chip disposed on an uppermost second semiconductor chip among the stacked second semiconductor chips to be electrically connected to the second through-electrodes of the uppermost second semiconductor chip.

In another embodiment of the present invention, a method for manufacturing a stack package comprises the steps of attaching first semiconductor chips each having a first surface on which bonding pads are disposed, a second surface which faces away from the first surface, and first through-electrodes which are formed to a depth not reaching the second surface when measured from the first surface, onto a temporary wafer such that the first surface faces the temporary wafer; forming a molding part on the temporary wafer to cover the first semiconductor chips; processing the molding part and the second surface of each first semiconductor chip to expose the first through-electrodes; stacking one or more second semiconductor chips possessing a second size greater than the first size and having second through-electrodes which are electrically connected to one another and to the first through-electrodes, on the processed molding part and second surface of each first semiconductor chip; forming an encapsulation member on the processed molding part including the stacked second semiconductor chips; removing the temporary wafer to expose the first surface of the first semiconductor chip including the bonding pads and the first through-electrodes; forming redistribution lines on the first surface of the first semiconductor chip and the molding part to be respectively connected with the bonding pads; forming an insulation layer on the first surface of the first semiconductor chip including the redistribution lines and the molding part to expose portions of the redistribution lines; and attaching external connection terminals to exposed portions of the redistribution lines.

After the step of attaching the external connection terminals, the method may further comprise the step of cutting a resultant structure into unit level.

DESCRIPTION OF SPECIFIC EMBODIMENTS

Hereafter, specific embodiments of the present invention will be described in detail with reference to the accompanying drawings.

It is to be understood herein that the drawings are not necessarily to scale and in some instances proportions may have been exaggerated in order to more clearly depict certain features of the invention.

Figure 1:
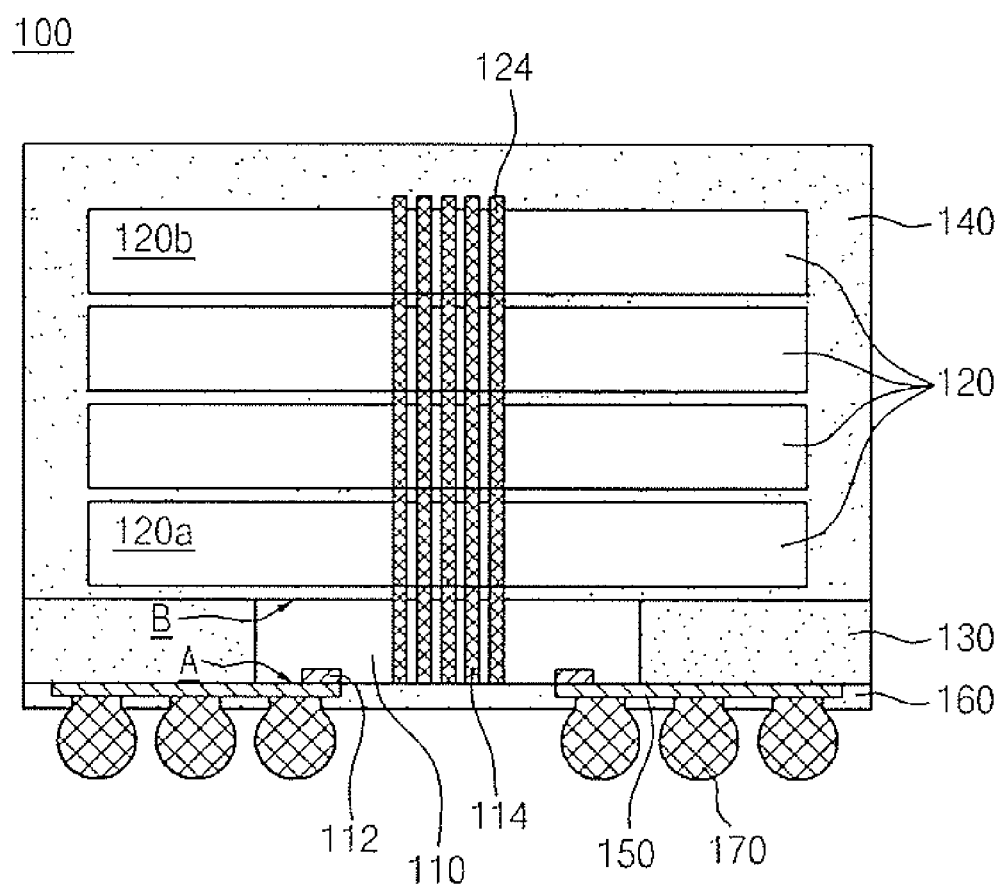
FIG. 1 is a cross-sectional view showing a stack package in accordance with an embodiment of the present invention.

FIG. 1 is a cross-sectional view showing a stack package in accordance with a first embodiment of the present invention.

Referring to FIG. 1, a stack package 100 in accordance with an embodiment of the present invention includes a first semiconductor chip 110, a molding part 130 which surrounds the side surfaces of the first semiconductor chip 110, and one or more second semiconductor chips 120 which are stacked on the first semiconductor chip 110 and the molding part 120.

In the embodiment, the first semiconductor chip 110 has a first surface A on which bonding pads 112 are disposed, and a second surface B which faces away from the first surface A. A plurality of first through-electrodes 114 are formed in the first semiconductor chip 110 and pass through the body of the first semiconductor chip from the first surface A to the second surface B. For example, the first through-electrodes 114 may be formed so as to penetrate through the center portion of the first semiconductor chip 110. The first semiconductor chip 110 has a first size and, for example, a quadrangular shape when viewed from the top. For example, when viewing the second surface B of the first semiconductor chip, the area of the second surface B has the first size, whereby a step is formed between the first semiconductor chip 110 and the second semiconductor chips 120.

Meanwhile, although not shown, it may be understood that the first semiconductor chip 110 has a circuit section formed therein, and that connection lines for electrically connecting the bonding pads 112 to their corresponding first through-electrodes 114 are formed on the first surface A of the first semiconductor chip 110.

In an embodiment, the second semiconductor chip 120 has a quadrangular shape when viewed from the top and a second size that is greater than the first size of the first semiconductor chip 110. That is to say, the area of the second semiconductor chip 120 when viewed from the top is the second size which is greater than the first size. One or more second semiconductor chips 120 (four are shown in FIG. 1) are vertically stacked on the second surface B of the first semiconductor chip 110. The one or more stacked second semiconductor chips 120 have a plurality of second through-electrodes 124. The second through-electrodes 124 are formed at positions corresponding to the first through-electrodes 114 formed through the first semiconductor chip 110 so that they can be electrically connected to each other and to the first through-electrodes 114. In an embodiment, the second through-electrodes 114 of the individual second semiconductor chips are formed at the center portions of the second semiconductor chips 120 and are aligned with the first through electrodes 114 so as to be electrically connected to one another and to the first through-electrodes 114 of the first semiconductor chip 110.

Meanwhile, although not shown, it may be understood that, similar to the case of the first semiconductor chip 110, the one or more second semiconductor chips 120 have circuit sections formed therein, and that bonding pads and connection lines for electrically connecting the bonding pads to their corresponding second through-electrodes 124 are formed on the surfaces of the second semiconductor chips 120 which face the second surface B of the first semiconductor chip 110.

In the embodiment shown in FIG. 1, the molding part 130 is formed to surround the side surfaces of the first semiconductor chip 110 which has the first size, and through this, the combination of the molding part 130 and the first semiconductor chip 110 has a size that is equal to or greater than the second size of the second semiconductor chips 120. While it is preferred that the molding part 130 be formed to surround all four side surfaces of the first semiconductor chip 110 having the quadrangular shape, as the case may be, it is conceivable that the total size may be increased sufficiently by forming the molding part 130 so that it borders on (abuts) only one or more but not all four side surfaces of the first semiconductor chip. For example, in an embodiment, the molding part may be formed on only two opposite side surfaces of the first semiconductor chip 110. Accordingly, the molding part 130 can be understood as securing structural stability when stacking the second semiconductor chips 120 having the second size greater than the first size on the first semiconductor chip 110 having the first size.

The stack package 100 in accordance with an embodiment of the present invention further includes an encapsulation member 140 which is formed on the molding part 130 including one or more stacked second semiconductor chips 120. The encapsulation member 140 functions to protect the first and second semiconductor chips 110 and 120 from external influences, and can be made of a material, for example, such as an EMC (epoxy molding compound).

The stack package 100 in accordance with an embodiment of the present invention may further include an underfill (not shown) which is formed between the second semiconductor chip 120 (hereinafter referred to as a "lowermost second semiconductor chip 120a") disposed lowermost among the one or more stacked second semiconductor chips 120 and the first semiconductor chip 110 and between the lowermost second semiconductor chip 120a and the molding part 130. A filler may also be formed between the stacked second semiconductor chips 120. Of course, in the stack package 100 in accordance with an embodiment of the present invention, the underfill may be omitted, and instead, the spaces between the lowermost second semiconductor chip 120a and the first semiconductor chip 110, between the lowermost second semiconductor chip 120a and the molding part 130, and between the stacked second semiconductor chips 120 may be filled with the encapsulation member 140.

The stack package 100 in accordance with an embodiment of the present invention further includes: redistribution lines 150 which are formed on the first surface A of the first semiconductor chip 110 and which are electrically connected to corresponding bonding pads 112; an insulation layer 160 which is formed on the first surface A of the first semiconductor chip 110 including the redistribution lines 150, and which is formed so as to expose portions of the redistribution lines 150; and external connection terminals 170 which are respectively attached to the exposed portions of the redistribution lines 150. The insulation layer 160 comprises, for example, solder resist; and the external connection terminals 170 comprise, for example, solder balls.

While not shown, the stack package 100 in accordance with an embodiment of the present invention may further include a third semiconductor chip which is disposed on the second semiconductor chip 120 (hereinafter referred to as an "uppermost second semiconductor chip 120b") disposed uppermost among the one or more stacked second semiconductor chips 120, and which is electrically connected to the second through-electrodes 124 of the uppermost second semiconductor chip 120b. The third semiconductor chip can be understood as being formed with a circuit section therein, and is formed without separate through-electrodes. The third semiconductor chip has a plurality of bonding pads which are disposed on the surface of the third semiconductor chip facing the uppermost second semiconductor chip 120b, and the bonding pads are electrically connected to the second through-electrodes 124 of the uppermost second semiconductor chip 120b.

As is apparent from the above description, in a package in accordance with an embodiment of the present invention, since the combined size of the first size of a first semiconductor chip and the size of a molding part is equal to or greater than the second size of a second semiconductor chip, structural stability can be secured even when stacking one or more second semiconductor chips on the first semiconductor chip and the molding part.

As such, the package in accordance with the first embodiment of the present invention provides advantages in that the manufacturing yield can be increased and the reliability of products can be improved due to the securement of the structural stability.

FIGS. 2A through 2H are cross-sectional views showing a method for manufacturing the stack package in accordance with an embodiment of the present invention. The method will be described below.

Figure 2A:
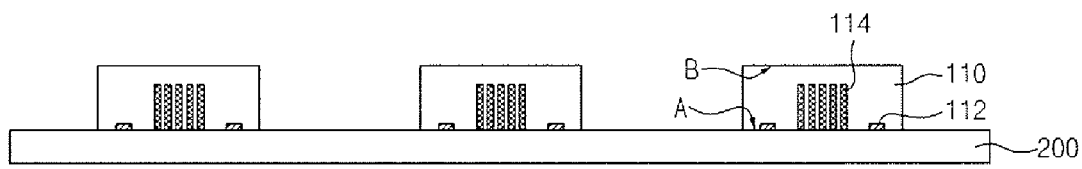
FIGS. 2A through 2H are cross-sectional views shown for illustrating a method for manufacturing the stack package in accordance with an embodiment of the present invention.

Referring to FIG. 2A, a plurality of first semiconductor chips 110 are attached onto a temporary wafer 200 at regular intervals. The temporary wafer 200 comprises a bare wafer or a wafer-shaped film. Each first semiconductor chip 110 has a first surface A on which bonding pads 112 are disposed and a second surface B which faces away from the first surface A. First through-electrodes 114 are formed to a depth not reaching the second surface B when measured from the first surface A. Each first semiconductor chip 110 has a first size. These first semiconductor chips 110 are attached in such a manner that their first surfaces A face the temporary wafer 200.

Figure 2B:
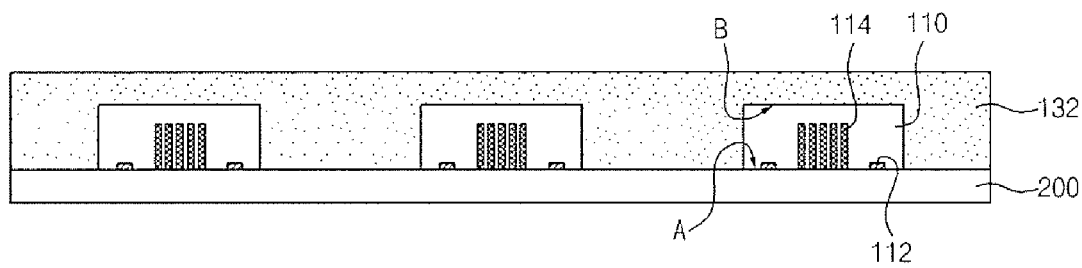

Referring to FIG. 2B, a molding material 132 is formed on the temporary wafer 200 to cover the first semiconductor chips 110. The molding material 132 includes, for example, epoxy, polymer, an EMC, and so forth.

Figure 2C:
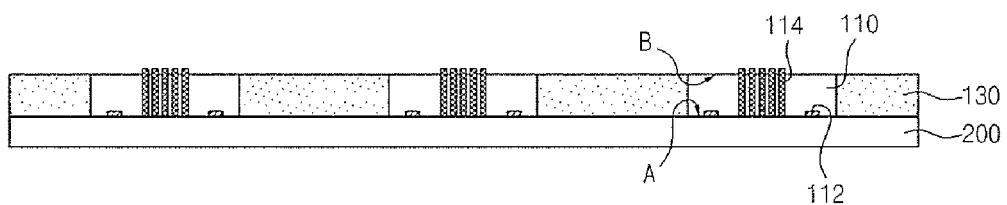

Referring to FIG. 2C, a partial thickness of the molding material 132 and the first semiconductor chips 110 is removed, and through this, a molding part 130 exposing the first through-electrodes 114 of the first semiconductor chips 110 and surrounding the side surfaces of the first semiconductor chips 110 is formed.

While it is preferred that the molding part 130 be formed to surround all four side surfaces of the first semiconductor chips 110 when the first semiconductor chip has a quadrangular shape, it is conceivable that the total size may be increased sufficiently by forming the molding part 130 so that it borders on only one or more but not all four side surface of the first semiconductor chip. For examiner, in an embodiment, the molding part may be formed on only two opposite side surfaces of each first semiconductor chip 110. In this case, the molding material 132 in the previous step can be understood as being patterned to cover only two opposite side surfaces and the upper surface of each first semiconductor chip 110 after the molding material 132 is formed.

Figure 2D:
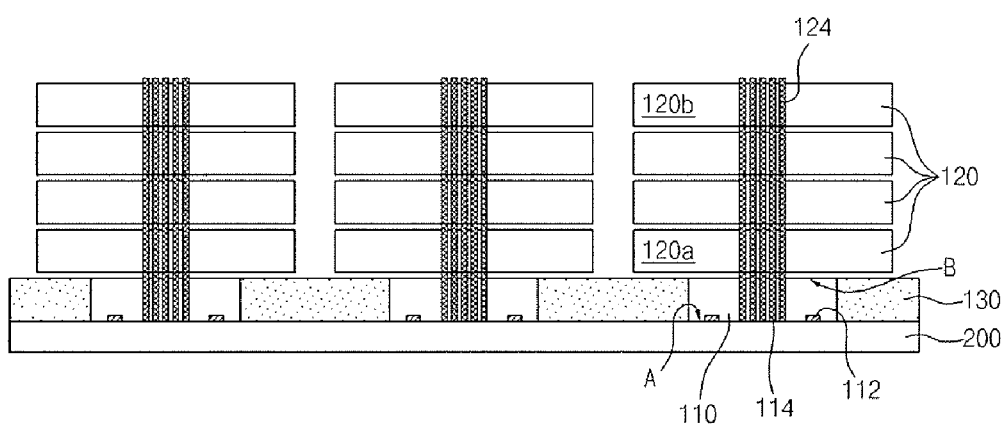

Referring to FIG. 2D, one or more second semiconductor chips 120 are stacked on each of the first semiconductor chips 110 and the abutting or surrounding molding part 130. The second semiconductor chips 120 have a second size greater than the first size of the first semiconductor chips 110. Therefore, when the one or more second semiconductor chips 120 are stacked on a first semiconductor chip 110, the one or more second semiconductor chips are also stacked on the molding part 130 which surrounds/abuts the first semiconductor chip 110. The one or more stacked second semiconductor chips 120 have second through-electrodes 124 formed therein. The second through-electrodes 124 are electrically connected to one another and to the first through-electrodes 114 of the first semiconductor chip 110 on which the one or more second semiconductor chips 120 are stacked. In an embodiment, the first through-electrodes 114 of the first semiconductor chip 110 and the second through-electrodes 124 of the second semiconductor chips 120 are electrically connected to each other by being aligned along vertical lines as shown in the FIG. 2D.

Here, since the second semiconductor chips 120 are stacked on each first semiconductor chip 110 and the molding part 130, even though the second semiconductor chips 120 have a size greater than the first semiconductor chip 110, they can be stacked in a structurally stable manner.

Figure 2E:
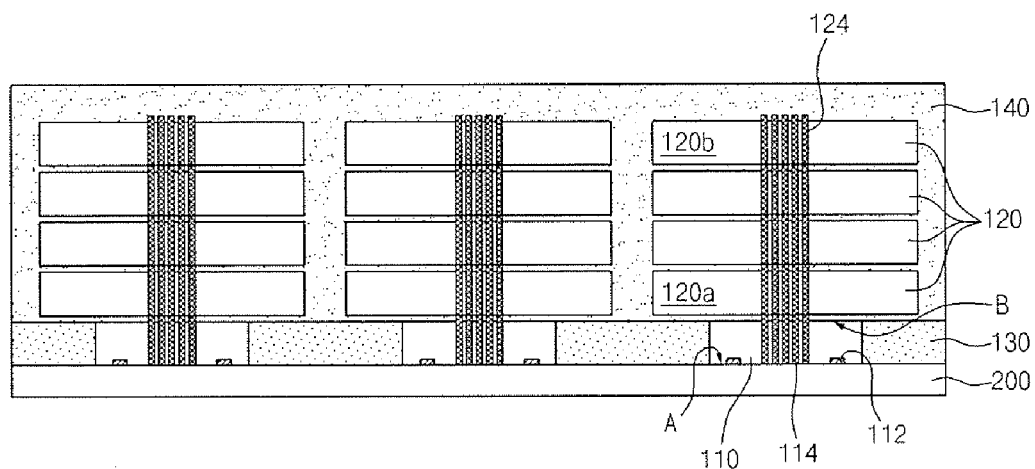

Referring to FIG. 2E, an encapsulation member 140 is formed on the molding part 130 including on the one or more stacked second semiconductor chips 120. The encapsulation member 140 comprises, for example, an EMC.

Before forming the encapsulation member 140, a third semiconductor chip (not shown), in which through-electrodes are not formed and bonding pads are disposed on the surface facing the uppermost second semiconductor chip 120b, can be additionally attached to the uppermost second semiconductor chip 120b.

Before the encapsulation member 140 is formed, irrespective of whether the third semiconductor chip is attached or not, an underfill (not shown) may be additionally formed between the lowermost semiconductor chip 120a and the first semiconductor chip 110 and abutting molding part 130. The underfill may also be formed between the stacked second semiconductor chips 120. Of course, the underfill may be omitted, and, in this case, the spaces between the lowermost second semiconductor chip 120a and the first semiconductor chip 110 and abutting molding part 130 and the spaces between the stacked second semiconductor chips 120 are filled with the encapsulation member 140.

Figure 2F:
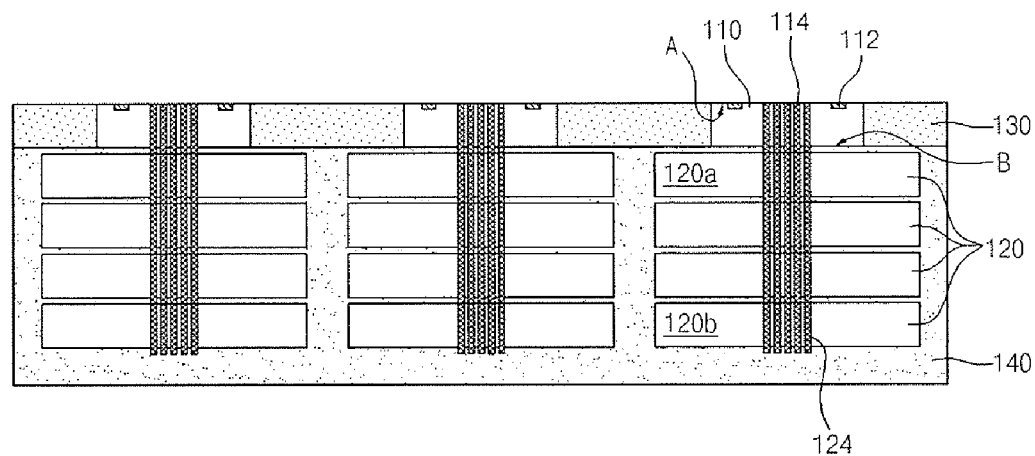

Referring to FIG. 2F, the resultant structure which has passed through the previous processing steps and is formed with the encapsulation member 140 is turned upside down such that the temporary wafer 200 faces upwards. In this state, the temporary wafer 200 is removed such that the first surface A of the first semiconductor chip 110, the bonding pads 112 disposed on the first surface A, and the first through-electrodes 114 are exposed.

Figure 2G:
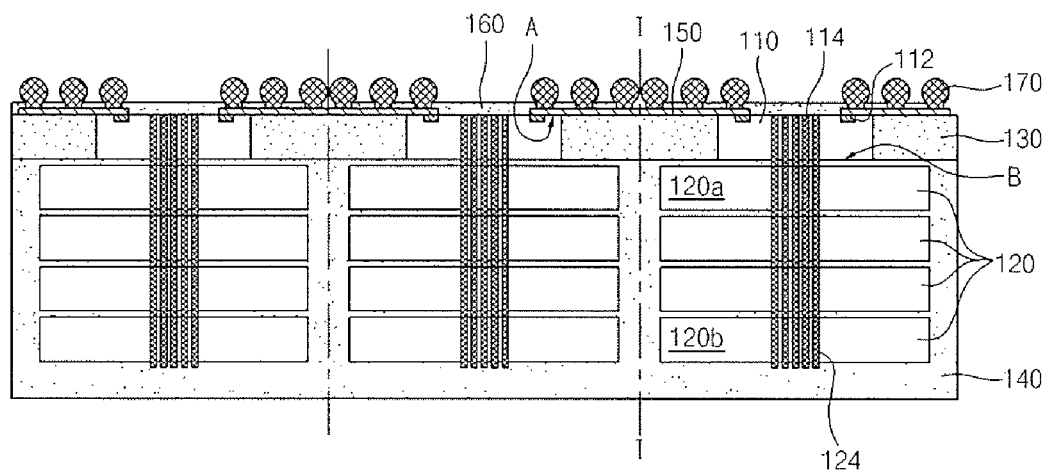

Referring to FIG. 2G, redistribution lines 150 are formed on the exposed first surface A of the first semiconductor chip 110 and the abutting molding part 130 so as to be respectively connected to the exposed bonding pads 112. The redistribution lines 150 are formed through, for example, an electroplating or an electroless plating. Then, after forming an insulation layer 160 on the first surface A of the first semiconductor chip 110 and the molding part 130 so as to cover the redistribution lines 150, by etching the insulation layer 160, portions of the redistribution lines 150 are exposed. Thereafter, external connection terminals 170 such as solder balls are attached to the exposed portions of the redistribution lines 150.

Figure 2H:
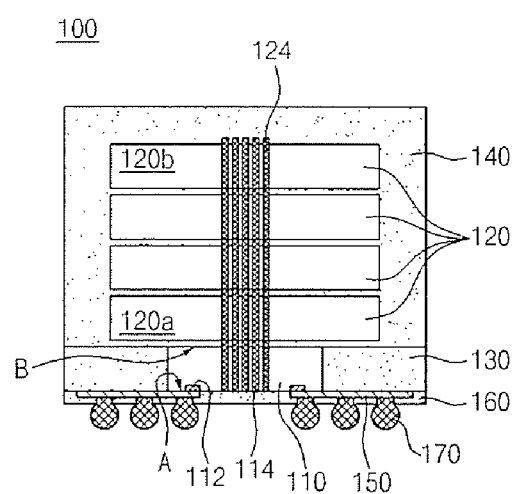

Referring to FIG. 2H, the resultant structure, which has passed through the previous processing steps and is attached to the external connection terminals 170, is cut through the lines I-I'. Due to this fact, a plurality of stacked packages manufactured at a strip level are separated from one another into a unit level, and through this, the manufacture of the stack package 100 in accordance with an embodiment of the present invention is completed.

In the above-described method according to an embodiment of the present invention, since second semiconductor chips having a size greater than a first semiconductor chip are stacked on the first semiconductor chip in the state in which the side surfaces of the first semiconductor chip are surrounded by a molding part through using a reconfiguration wafer manufacturing technology, the process of stacking the second semiconductor chips can be easily and stably conducted.

Hence, in the present invention, because structure stability can be secured when stacking the second semiconductor chips, the manufacturing yield can be increased and the reliability of products can be improved.

Figure 3:
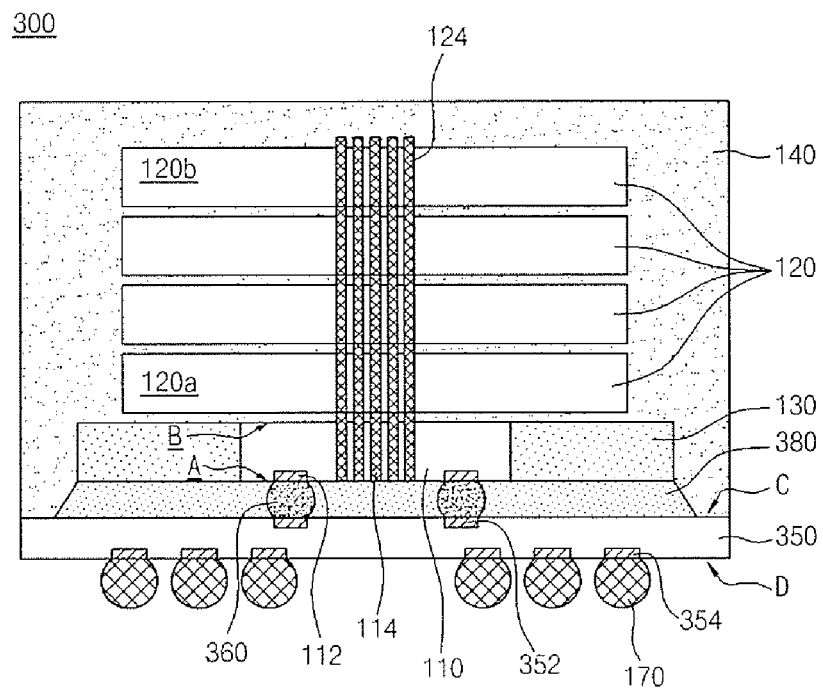
FIG. 3 is a cross-sectional view showing a stack package in accordance with an embodiment of the present invention.

FIG. 3 is a cross-sectional view showing a stack package in accordance with another embodiment of the present invention. The stack package shown in FIG. 3 may be substantially the same as the stack package according to the above-described embodiment of the present invention, except a substrate and an electrical connection structure between the substrate and a first semiconductor chip. Therefore, descriptions for the same component parts will be omitted herein, and the same technical terms and the same reference numerals will be used to refer to the same or like component parts.

Referring to FIG. 3, a stack package 300 in accordance with an embodiment of the present invention includes a substrate 350 which is disposed below the first semiconductor chip 110, and connection members 360 which electrically connect the first semiconductor chip 110 and the substrate 350.

In the embodiment shown in FIG. 3, the substrate 350 has a third surface C which faces the first surface A of the first semiconductor chip 110 and on which first connection pads 352 to be electrically connected to the bonding pads 112 of the first semiconductor chip 110 are disposed, and a fourth surface D which faces away from the third surface C and on which second connection pads 354 are disposed. The substrate 350 comprises, for example, a printed circuit board.

The connection members 360 electrically connect the bonding pads 112 of the first semiconductor chip 110 and the first connection pads 352 of the first substrate 350 which face each other, and can comprise, for example, solder bumps or stud bumps.

The stack package 300 in accordance with an embodiment of the present invention further includes an underfill 380 which is formed in the space defined between the first semiconductor chip 110 and the substrate 350 and between the abutting molding part 130 and the substrate 350. The underfill 380 can be understood as being formed to improve or maintain the electrical or physical coupling force between the first semiconductor chip 110 and the substrate 350 by the connection members 360.

In the stack package 300 in accordance with an embodiment of the present invention, an encapsulation member 140 is formed to cover the third surface C of the substrate 350 including the molding part 130 and the one or more stacked second semiconductor chips 120. External connection terminals 170, such as, for example, solder balls, are attached to the second connection pads 354 which are disposed on the fourth surface D of the substrate 350.

Although not shown, the stack package 300 in accordance with an embodiment of the present invention may further include an underfill which is formed between the first semiconductor chip 110 and abutting molding part 130 and the lowermost second semiconductor chip 120a. The underfill may also be formed between the stacked second semiconductor chips 120.

Also, while not shown, the stack package 300 in accordance with an embodiment of the present invention may further include a third semiconductor chip which is disposed on the uppermost second semiconductor chip 120b. Similar to the aforementioned embodiments, the third semiconductor chip can be understood as being formed with a circuit section therein and without separate through-electrodes. The third semiconductor chip has bonding pads which are disposed on the surface of the third semiconductor chip facing the uppermost second semiconductor chip 120b and are electrically connected to the second through-electrodes 124 of the uppermost second semiconductor chip 120b.

Figure 4:
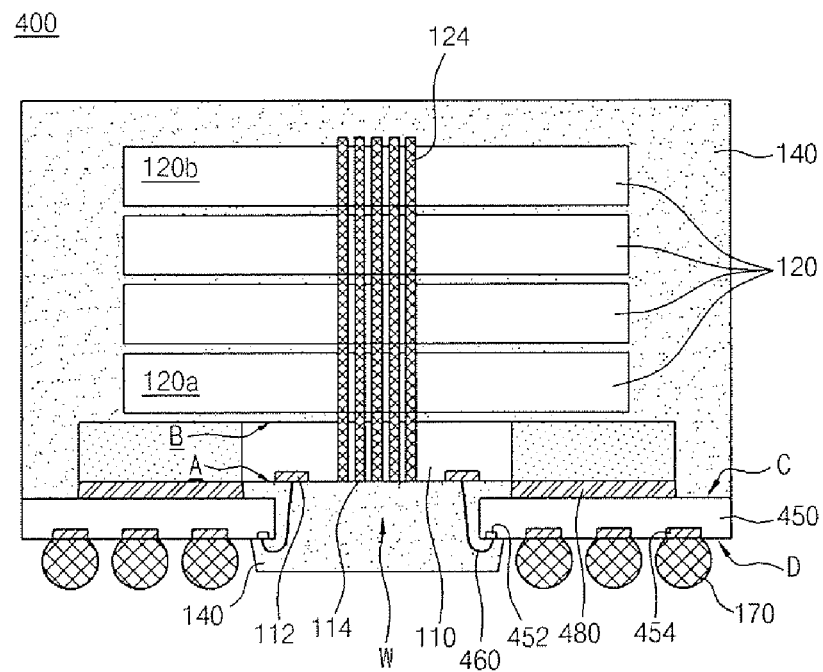
FIG. 4 is a cross-sectional view showing a stack package in accordance with an embodiment of the present invention.

FIG. 4 is a cross-sectional view showing a stack package in accordance with another embodiment of the present invention. The stack package according to the embodiment of the present invention shown in FIG. 4 is substantially the same as the stack package shown in FIG. 1, except a substrate and an electrical connection structure between the substrate and a first semiconductor chip. Therefore, descriptions for the same component parts will be omitted herein, and the same technical terms and the same reference numerals will be used to refer to the same or like component parts.

Referring to FIG. 4, a stack package 400 in accordance with an embodiment of the present invention includes a substrate 450 which has a window W and connection members 460 which electrically connect the first semiconductor chip 110 and the substrate 450.

In the embodiment shown in FIG. 4, the window W of the substrate 450 is an opening in the substrate 450 and is defined to expose the first surface A of the first semiconductor chip 110 which includes the bonding pads 112 and the first through-electrodes 114. The substrate 450 has a third surface C which faces the first surface A of the first semiconductor chip 110, and a fourth surface D which faces away from the third surface C. First connection pads 452 are disposed on the fourth surface D to be electrically connected to the bonding pads 112 of the first semiconductor chip 110. Second connection pads 454 are disposed on the fourth surface D outside the first connection pads 452. Preferably, the first connection pads 452 are disposed on the fourth surface D of the substrate 450 adjacent to the window W, and the second connection pads 454 are disposed in a plural number on the fourth surface D of the substrate 450 outside the first connection pads 452 so as to be separated from the window W. The substrate 450 having the window W comprises, for example, a printed circuit board.

In the embodiment, the connection members 460 pass through the window W of the substrate 450 in order to electrically connect the bonding pads 112 of the first semiconductor chip 110 and the first connection pads 452 of the substrate 450. The connection members 460 may comprise, for example, metal wires.

The stack package 400 in accordance with an embodiment of the present invention further includes an adhesive member 480 which is interposed between the molding part 130 and the substrate 450.

In the stack package 400 in accordance with an embodiment of the present invention, an encapsulation member 140 is formed to cover the third surface C of the substrate 450 including the molding part 130 and the one or more stacked second semiconductor chips 120. The encapsulation member fills the window W of the substrate 450 including the connection members 460. External connection terminals 170 such as, for example, solder balls are attached to the second connection pads 454 which are disposed on the fourth surface D of the substrate 350.

Similarly, although not shown, the stack package 400 in accordance with an embodiment of the present invention may further include an underfill which is formed between the first semiconductor chip 110 and abutting molding part 130 and the lowermost second semiconductor chip 120a. The underfill may also be formed between the stacked second semiconductor chips 120.

Also, while not shown, the stack package 400 in accordance with an embodiment of the present invention may further include a third semiconductor chip which is disposed on the uppermost second semiconductor chip 120b. The third semiconductor chip can be understood as being formed with a circuit section therein and without separate through-electrodes. The third semiconductor chip has bonding pads which are disposed on the surface of the third semiconductor chip facing the uppermost second semiconductor chip 120b and are electrically connected to the second through-electrodes 124 of the uppermost second semiconductor chip 120b.

Figure 5:
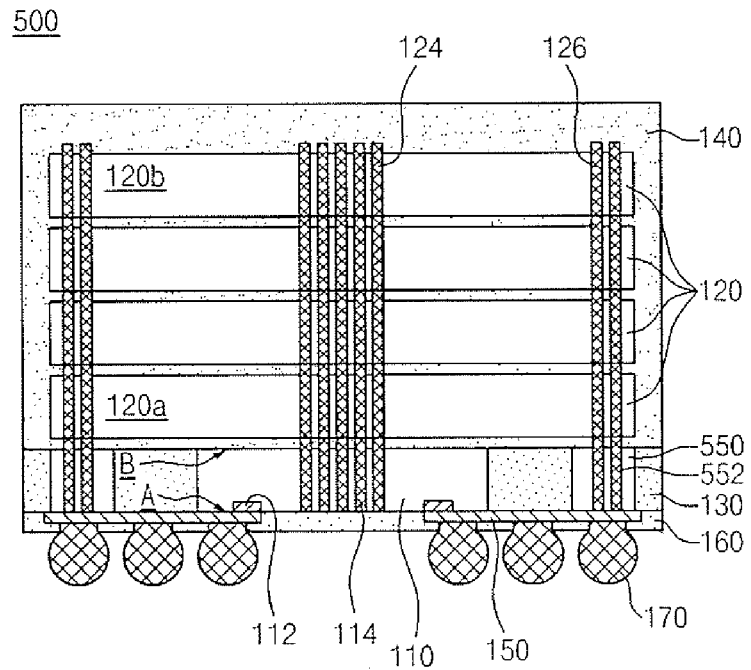
FIG. 5 is a cross-sectional view showing a stack package in accordance with an embodiment of the present invention.

FIG. 5 is a cross-sectional view showing a stack package in accordance with another embodiment of the present invention. The stack package according to the embodiment shown in FIG. 5 is substantially the same as the stack package shown in FIG. 1, except a dummy chip and an electrical connection structure. Therefore, descriptions for the same component parts will be omitted herein, and the same technical terms and the same reference numerals will be used to refer to the same or like component parts.

Referring to FIG. 5, a stack package 500 in accordance with an embodiment of the present invention includes a dummy chip 550 which is disposed under the lowermost second semiconductor chip 120a. As shown in FIG. 5, the dummy chip 550 is separated from the first semiconductor chip 110.

In an embodiment, the dummy chip 550 does not include a circuit section therein, but is formed with a plurality of fourth through-electrodes 552 passing therethrough.

One or more stacked second semiconductor chips 120 have not only the second through-electrodes 124 which are electrically connected to the first through-electrodes 114 of the first semiconductor chip 110, but also third through-electrodes 126 which are formed through portions of the second semiconductor chips 120 and which are separated from the second through-electrodes 124. In an embodiment, the third through electrodes are formed through the edge portions of the second semiconductor chips 120 located over the dummy chip 550. The third through-electrodes 126 of the respective second semiconductor chips 120 are electrically connected to one another. The third through-electrodes 126 which are formed through the lowermost second semiconductor chip 120a are electrically connected to the fourth through-electrodes 552 which are formed through the dummy chip 550. In addition, the fourth through-electrodes 552 which are formed through the dummy chip 550 are electrically connected to the redistribution lines 150.

In an embodiment, the molding part 130 is formed to surround the side surfaces of not only the first semiconductor chip 110 but also the dummy chip 550. The molding part 130 may also be formed so that it abuts only one or more but not all side surfaces of the first semiconductor chip. In this case, the molding part 130 may be formed so as to abut side surfaces of the dummy chip 550 corresponding to the side surfaces of the first semiconductor chip on which the molding part 130 is formed.

In the stack package 500 in accordance with an embodiment of the present invention, an encapsulation member 140 is formed to cover the molding part 130 and the one or more stacked second semiconductor chips 120. Redistribution lines 150 are formed on the first surface A of the first semiconductor chip 110 and are electrically connected to the bonding pads 112. An insulation layer 160 is formed on the first surface A of the first semiconductor chip 110 including the redistribution lines 150 and includes openings exposing portions of the redistribution lines 150. External connection terminals 170 are attached to the exposed portions of the redistribution lines 150.

Although not shown, the stack package 500 in accordance with an embodiment of the present invention may further include an underfill which is formed between the first semiconductor chip 110, dummy chip 550, molding part 130 and the lowermost second semiconductor chip 120a. The underfill may also be formed between the stacked second semiconductor chips 120. Further, a third semiconductor chip may be disposed on the uppermost second semiconductor chip 120b. The third semiconductor chip can be understood as having the same construction as in the aforementioned embodiments.

Figure 6:
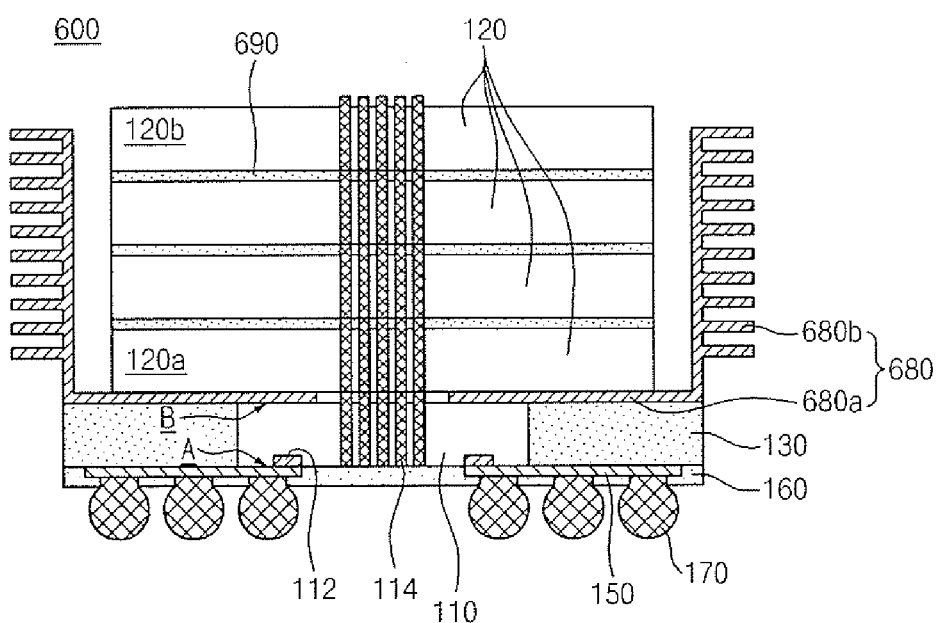
FIG. 6 is a cross-sectional view showing a stack package in accordance with an embodiment of the present invention.

FIG. 6 is a cross-sectional view showing a stack package in accordance with another embodiment of the present invention. The stack package shown in FIG. 6 is substantially the same as the stack package shown in FIG. 1, except a heat spreader and an encapsulation structure. Therefore, descriptions for the same component parts will be omitted herein, and the same technical terms and the same reference numerals will be used to refer to the same or like component parts.

Referring to FIG. 6, a stack package 600 in accordance with an embodiment of the present invention includes a heat spreader 680, a portion of which is disposed between the first semiconductor chip 110, molding part 130 and the lowermost second semiconductor chip 120a and a portion of which extends upwards along the side surfaces of the one or more stacked second semiconductor chips 120.

In an embodiment, the heat spreader 680 functions to quickly dissipate the heat generated in the first semiconductor chip 110 and the one or more stacked second semiconductor chips 120 to the outside. Preferably, the heat spreader 680 is made of a material having excellent heat dissipation characteristics, for example, a metal.

In an embodiment, the heat spreader 680 has a horizontal section 680a which is disposed between the first semiconductor chip 110, molding part 130 and the lowermost second semiconductor chip 120a, and a vertical section 680b which extends from the ends of the horizontal section 680a along the side surfaces of the one or more second semiconductor chips 120. The vertical section 680b is formed, for example, in a comb-like shape, so that excellent heat dissipation characteristics can be accomplished.

As shown in the FIG. 6, the vertical section 680b does not contact and is separated from the side surfaces of the stacked second semiconductor chips 120. However, it is conceivable that the vertical section 680b is disposed to contact the side surfaces of the stacked second semiconductor chips 120. In the case where the vertical section 680b is disposed to be separated from the side surfaces of the stacked second semiconductor chips 120, the spaces between the vertical section 680b and the stacked second semiconductor chips 120 may be filled with an underfill.

In an embodiment, the spaces between the stacked second semiconductor chips 120 are filled with an underfill 690. The underfill acts to maintain the coupling force between the second through-electrodes 124 of the one or more stacked second semiconductor chips 120, and also to protect the active surfaces of the stacked second semiconductor chips 120 (the active surfaces being the surfaces on which the bonding pads are formed) from external influences.

In the stack package 600 in accordance with an embodiment of the present invention, redistribution lines 150 are formed on the first surface A of the first semiconductor chip 110 and are electrically connected to the bonding pads 112. An insulation layer 160 is formed on the first surface A of the first semiconductor chip 110 including the redistribution lines 150 and includes openings exposing portions of the redistribution lines 150. External connection terminals 170 are attached to the exposed portions of the redistribution lines 150.

Although not shown, the stack package 600 in accordance with an embodiment of the present invention may further include a third semiconductor chip which is disposed on the uppermost second semiconductor chip 120b. The third semiconductor chip can be understood as having the same construction as in the aforementioned embodiments. Similarly, it can be appreciated that the underfill 690 may be formed between the uppermost second semiconductor chip 120b and the third semiconductor chip.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A stack package comprising:
a first semiconductor chip possessing a first size and having a first surface and a second surface which faces away from the first surface, the first semiconductor chip comprising bonding pads disposed on the first surface and one or more first through-electrodes which pass through the first surface and the second surface;
one or more second semiconductor chips possessing a second size greater than the first size, and being stacked on the second surface of the first semiconductor chip, the one or more second semiconductor chips comprising one or more second through-electrodes which are electrically connected to one another and to the one or more first through-electrodes; and
a molding part abutting one or more side surfaces of the first semiconductor chip such that a total size including the first size and a size of the molding part is equal to or greater than the second size.

2. The stack package according to claim 1, further comprising:
a third semiconductor chip disposed on an uppermost second semiconductor chip among the one or more stacked second semiconductor chips, the third semiconductor chip being electrically connected to the second through-electrodes of the uppermost second semiconductor chip.

3. The stack package according to claim 1, further comprising:
an encapsulation member formed on the molding part including the one or more stacked second semiconductor chips;
redistribution lines formed on the first surface of the first semiconductor chip and electrically connected to the bonding pads;
an insulation layer formed on the first surface of the first semiconductor chip including the redistribution lines, the insulation layer having openings exposing portions of the redistribution lines; and
external connection terminals attached to exposed portions of the redistribution lines.

4. The stack package according to claim 3, further comprising:
an underfill formed between the first semiconductor chip and a lowermost semiconductor chip among the one or more stacked second semiconductor chips and between the stacked second semiconductor chips.

5. The stack package according to claim 1, wherein the first semiconductor chip has a quadrangular shape, and the molding part is formed to cover two opposite side surfaces or to surround all four side surfaces of the first semiconductor chip.

6. The stack package according to claim 1, further comprising:
a substrate having a third surface which faces the first surface of the first semiconductor chip and a fourth surface which faces away from the third surface, the substrate comprising connection pads disposed on the third surface and electrically connected to the bonding pads of the first semiconductor chip, and second connection pads disposed on the fourth surface;
connection members electrically connecting the bonding pads of the first semiconductor chip and the first connection pads of the substrate;
an encapsulation member formed on the third surface of the substrate including the second semiconductor chips and the molding part; and
external connection terminals attached to the second connection pads of the substrate.

7. The stack package according to claim 6, further comprising:
an underfill formed in a space between the first semiconductor chip and the substrate and between the molding part and the substrate.

8. The stack package according to claim 1, further comprising:
a substrate having a window, a third surface which faces the first surface of the first semiconductor chip, and a fourth surface which faces away from the third surface, the substrate comprising first connection pads disposed on the fourth surface and electrically connected to the bonding pads of the first semiconductor chip, and second connection pads disposed on the fourth surface outside the first connection pads;
connection members passing through the window and electrically connecting the bonding pads of the first semiconductor chip and the first connection pads of the substrate;
an encapsulation member formed to seal the third surface of the substrate including the second semiconductor chips and the molding part, and the window of the substrate including the connection members; and
external connection terminals attached to the second connection pads of the substrate.

9. The stack package according to claim 8, further comprising:
an adhesive member interposed between the molding part and the substrate.

10. A stack package comprising:
a first semiconductor chip possessing a first size and having a first surface and a second surface which faces away from the first surface, the first semiconductor chip comprising bonding pads disposed on the first surface and one or more first through-electrodes which pass through the first surface and the second surface;
one or more second semiconductor chips possessing a second size greater than the first size, and being stacked on the second surface of the first semiconductor chip, the one or more second semiconductor chips comprising one or more second through-electrodes which are electrically connected to one another and to the one or more first through-electrodes and one or more third through-electrodes;

a dummy chip disposed under a lowermost second semiconductor chip among the one or more stacked second semiconductor chips, the dummy chip being separated from the first semiconductor chip and comprising fourth through-electrodes which are electrically connected to the third through-electrodes; and a molding part abutting one or more side surfaces of the first semiconductor chip and one or more side surfaces of the dummy chip such that a size that is equal to or greater than the second size is obtained.

11. The stack package according to claim 10, wherein the third through-electrodes are formed through portions of the second semiconductor chips which are separated from the second through-electrodes.

12. The stack package according to claim 10, wherein the dummy chip does not include a circuit section and is only formed the fourth through-electrodes therein.

13. The stack package according to claim 10, wherein the first semiconductor chip has a quadrangular shape and the molding part is formed to cover two opposite side surfaces of the first semiconductor chip, or to surround all four side surfaces of the first semiconductor chip and to surround the dummy chip.

14. The stack package according to claim 10, further comprising:
a third semiconductor chip disposed on an uppermost second semiconductor chip among the one or more stacked second semiconductor chips, the third semiconductor chip being electrically connected to the second through-electrodes of the uppermost second semiconductor chip.

15. The stack package according to claim 10, further comprising:
an encapsulation member formed on the molding part including the one or more stacked second semiconductor chips;
redistribution lines formed on the first surface of the first semiconductor chip so as to be electrically connected to the bonding pads and the fourth through-electrodes;
an insulation layer formed on the first surface of the first semiconductor chip including the redistribution lines, the insulation layer having openings exposing portions of the redistribution lines; and
external connection terminals attached to exposed portions of the redistribution lines.

16. The stack package according to claim 15, further comprising:
an underfill formed between the first semiconductor chip and a lowermost semiconductor chip among the one or more stacked second semiconductor chips and between the dummy chip and the lowermost semiconductor chip, and being formed between the stacked second semiconductor chips.

17. A stack package comprising:
a first semiconductor chip possessing a first size and having a first surface and a second surface which faces away from the first surface, the first semiconductor chip comprising bonding pads disposed on the first surface and one or more first through-electrodes which pass through the first surface and the second surface;
one or more second semiconductor chips possessing a second size greater than the first size, and being stacked on the second surface of the first semiconductor chip, the one or more second semiconductor chips comprising one or more second through-electrodes which are electrically connected to one another and to the one or more first through-electrodes;
a molding part abutting one or more side surfaces of the first semiconductor chip such that a total size including the first size and a size of the molding part is equal to or greater than the second size;
a heat spreader comprising a portion of which is disposed between the first semiconductor chip and a lowermost second semiconductor chip among the one or more stacked second semiconductor chips and between the molding part and the lowermost second semiconductor chip among the one or more stacked second semiconductor chips, and a portion of which extends along a side surface of the one or more stacked second semiconductor chips;
an underfill formed in spaces between the stacked second semiconductor chips;
redistribution lines formed on the first surface of the first semiconductor chip and electrically connected to the bonding pads;
an insulation layer formed on the first surface of the first semiconductor chip including the redistribution lines and having openings exposing portions of the redistribution lines; and
external connection terminals attached to exposed portions of the redistribution lines.

18. The stack package according to claim 17, wherein the head spreader is formed such that the portion of the heat spreader extending along the side surface of the one or more stacked second semiconductor chips contacts the side surface of the one or more stacked second semiconductor chips.

19. The stack package according to claim 17, wherein the heat spreader is formed such that the portion of the heat spreader extending along the side surface of the one or more stacked second semiconductor chips is separated from the side surface of the one or more stacked second semiconductor chips.

20. The stack package according to claim 19, further comprising:
an underfill formed in the space between the side surface of the one or more stacked second semiconductor chips and the heat spreader.

* * * * *